United States Patent
Kim et al.

(10) Patent No.: US 7,684,255 B2
(45) Date of Patent: Mar. 23, 2010

(54) METHOD OF OPERATING A NON-VOLATILE MEMORY DEVICE

(75) Inventors: You Sung Kim, Seoul (KR); Kwang Jun Cho, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 84 days.

(21) Appl. No.: 12/119,408

(22) Filed: May 12, 2008

(65) Prior Publication Data

US 2009/0168543 A1 Jul. 2, 2009

(30) Foreign Application Priority Data

Dec. 28, 2007 (KR) ...................... 10-2007-0140189

(51) Int. Cl.
*G11C 16/00* (2006.01)
(52) U.S. Cl. ..................... 365/185.29; 365/185.03; 365/185.2
(58) Field of Classification Search ............. 365/185.02
See application file for complete search history.

*Primary Examiner*—Tan T. Nguyen
(74) *Attorney, Agent, or Firm*—Townsend and Townsend and Crew LLP

(57) ABSTRACT

A method of operating a non-volatile memory device changes a read voltage by determining a degree that threshold voltages of memory cells are changed and overlap each other. The method of operating the non-volatile memory device includes performing a least significant bit (LSB) program of memory cells and determining a first error rate, performing a most significant bit (MSB) program of the memory cells and determining a second error rate, and setting a read voltage corresponding to a value at which the first and second error rates are minimum values.

18 Claims, 4 Drawing Sheets

METHOD OF OPERATING A NON-VOLATILE MEMORY DEVICE

CROSS-REFERENCES TO RELATED APPLICATIONS

The present application claims priority to Korean patent application number 10-2007-140189, filed on Dec. 28, 2007, which is incorporated by reference in its entirety.

BACKGROUND OF THE INVENTION

The present invention relates to non-volatile memory devices and, more particularly, to a method of operating a non-volatile memory device, in which a read voltage can be controlled according to the characteristics of a cell.

Flash memory such as non-volatile memory is generally classified into NAND flash memory and NOR flash memory. NOR flash memory has a structure in which memory cells are independently connected to bit lines and word lines and therefore exhibits an excellent random access time characteristic, NAND flash memory has a structure in which a plurality of memory cells is connected in series, requiring only one contact per cell string, and therefore exhibits an excellent integration characteristic. Accordingly, the NAND structure is generally used in high-integrated flash memory.

A typical NAND flash memory device includes a memory cell array, a row decoder, and a page buffer. The memory cell array is comprised of a plurality of word lines extending along rows, a plurality of bit lines extending along columns, and a plurality of cell strings corresponding to the bit lines.

In recent years, in order to further improve the level of integration of flash memory, active research has been done on a multi-bit cell that stores plural data in one memory cell. This type of memory cell is generally called a multi-level cell (MLC). A memory cell of a single bit is called a single level cell (SLC).

The flash memory may function improperly due to changed characteristics after operating for a long period of time.

FIG. 1 is a diagram showing threshold voltage distributions of a flash memory device.

Referring to FIG. 1, if memory cells of a flash memory device are programmed by a program operation, the threshold voltage of the memory cells is changed, resulting in a first threshold voltage distribution 110.

As program and erase operations are repeatedly performed on the memory cells, a degree that the memory cells programmed to have the first threshold voltage distribution 110 are programmed is varied. Consequently, the first threshold voltage distribution 110 of the memory cells can be changed to a second threshold voltage distribution 120.

A read voltage VR for reading data stored in the memory cells is previously set and not changed. When the memory cells are programmed to have the first threshold voltage distribution 110, there is no error in reading the data using the read voltage VR.

However, if the threshold voltage distribution of the memory cells is changed to the second threshold voltage distribution 120, an error occurs in reading the data using the read voltage VR. That is, memory cells in a region Pe of the second threshold voltage distribution 120 have to be recognized as an actually programmed state. However, since the threshold voltage distribution has been changed, the memory cells in the region Pe are recognized as being not programmed with respect to the read voltage VR. Accordingly, the likelihood of error increases in read data.

BRIEF SUMMARY OF THE INVENTION

The present invention is directed toward a method of operating a non-volatile memory device, which can change a read voltage by determining a degree that threshold voltages of memory cells are changed and overlap each other.

A method of operating a non-volatile memory device according to an aspect of the present invention includes performing a least significant bit (LSB) program of memory cells and determining a first error rate, performing a most significant bit (MSB) program of the memory cells and determining a second error rate, and setting a read voltage corresponding to a value where the first and second error rates are minimum values.

A method of operating a non-volatile memory device according to another aspect of the present invention includes programming data into memory cells and reading the data stored in the memory cells using a first read voltage, checking threshold voltage distributions of the read data, setting a second read voltage to a voltage level at which an area where neighboring threshold voltage distributions overlap each other becomes substantially identical with respect to each threshold voltage distribution, and performing a data read using the set second read voltage until the memory cells are erased.

A method of operating a non-volatile memory device according to still another aspect of the present invention includes programming data into memory cells and reading the data stored in the memory cells using a first read voltage, calculating an error probability function of the data by employing threshold voltage distributions of the read data and the first read voltage, calculating a second read voltage where the error probability function becomes a minimum value, and storing the calculated error probability function and the calculated second read voltage.

DESCRIPTION OF SPECIFIC EMBODIMENTS

Specific embodiments according to the present invention will be described with reference to the accompanying drawings. However, the present invention is not limited to the disclosed embodiments, but may be implemented in various manners. The embodiments are provided to complete the disclosure of the present invention and to allow those having ordinary skill in the art to understand the present invention. The present invention is defined by the scope of the claims.

Figure 1:
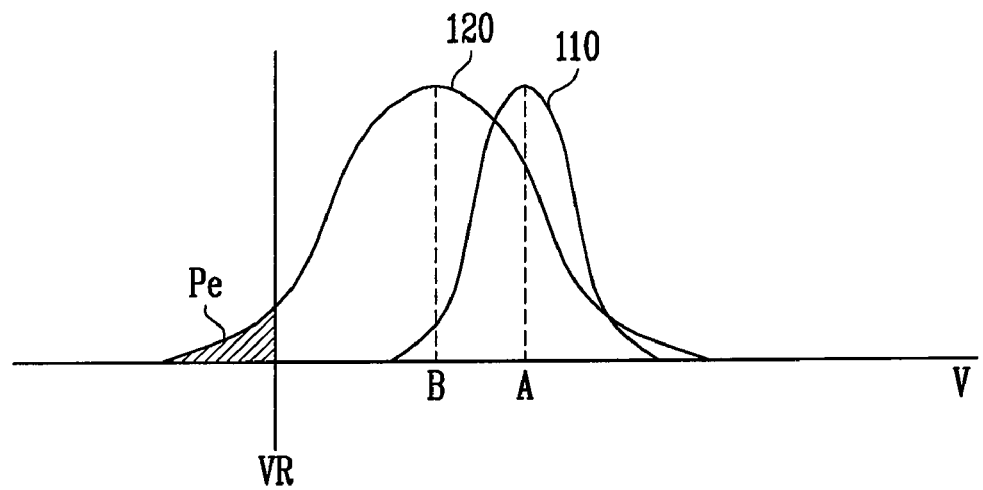
FIG. 1 is a diagram showing threshold voltage distributions of a flash memory device.
Figure 2A:
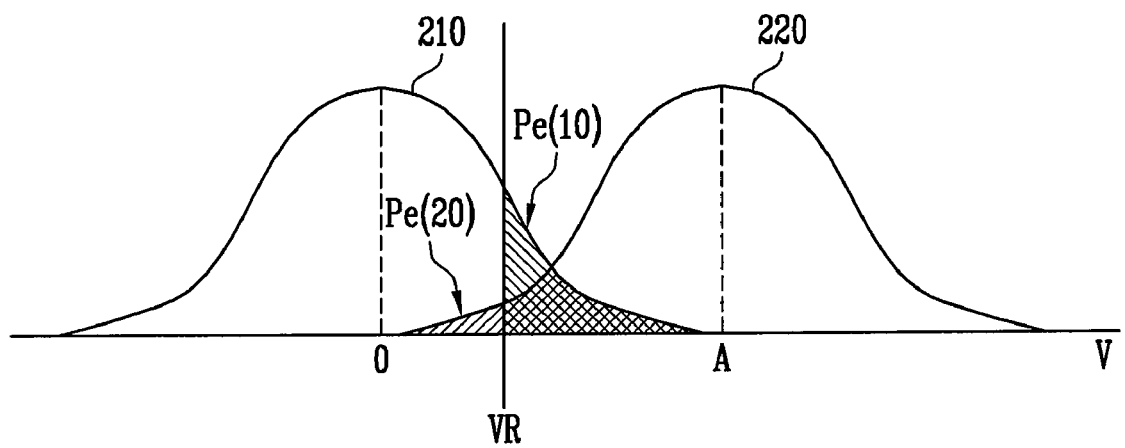
FIG. 2A is a diagram showing the shift of threshold voltage distributions of memory cells of a flash memory device.

FIG. 2A is a diagram showing the shift of threshold voltage distributions of memory cells of a flash memory device.

In particular, FIG. 2A shows first and second threshold voltage distributions 210, 220 of the threshold voltage distributions of a flash memory device. In this drawing, the first and second threshold voltage distributions 210, 220 are shifted and overlap each other.

Referring to FIG. 2A, if data is read using a preset read voltage VR, memory cells, which are programmed to have a threshold voltage higher than the read voltage VR, of memory cells belonging to the first threshold voltage distributions 210 and memory cells, which are programmed to have a threshold voltage lower than the read voltage VR, of memory cells belonging to the second threshold voltage distributions 220 have a read error.

An error rate Pe in which an error is generated in the first threshold voltage distributions 210 is referred to as a first error rate Pe(10), and an error rate Pe in which an error is generated in the second threshold voltage distributions 220 is referred to as a second error rate Pe(20). Further, a total error rate Pe can be calculated by the following Equation 1.

$$Pe = P(10) \times Pe(10) + P(20) \times Pe(20) \quad \text{[Equation 1]}$$

P(10) and P(20) are functions of the first and second threshold voltage distributions 210, 220, respectively. Data that can be stored in the memory cells of the flash memory device represents the error rate in the binary system of '1' or '0'.

Assuming that data stored in the binary system is random data, the distributions of '0' and '1' have the same value of 0.5. That is, it can be assumed that P(10) and P(20) have a constant value of 0.5. This is because the first threshold voltage distributions 210 include memory cells having not-programmed data '1' and the second threshold voltage distributions 220 include memory cells having programmed data '0' based on the read voltage VR.

Accordingly, the total error rate Pe can be calculated by the following Equation 2.

$$Pe = 0.5 \times (Pe(10) + Pe(20)) \quad \text{[Equation 2]}$$

Assuming that each error rate distribution is Guassian, a distribution probability is expressed by the following Equation 3.

$$P(v) = \frac{\exp\left(\frac{-v^2}{(2x\sigma^2)}\right)}{\sqrt{(2x\pi x\sigma^2)}} \quad \text{[Equation 3]}$$

Assuming that intermediate values of the respective distributions are 'O' and 'A', the following Equation 4 results.

$$Pe(10) = Q\left(\frac{VR}{\sigma}\right)$$

$$Pe(20) = Q\left(\frac{(A-VR)}{\sigma}\right) \quad \text{[Equation 4]}$$

Where Q is a complementary error function and a value thereof becomes a longitudinal section of Equation 4.

The value of the total error rate Pe has to satisfy $$\frac{dPe}{dVR} = 0,$$

which satisfies the first error rate Pe(10)=the second error rate Pe(20). Thus, if the read voltage VR is set to equate the areas of the two longitudinal sections so that that the relationship of the first error rate Pe(10)=the second error rate Pe(20) is satisfied, a minimum error probability can be obtained.

Figure 2B:
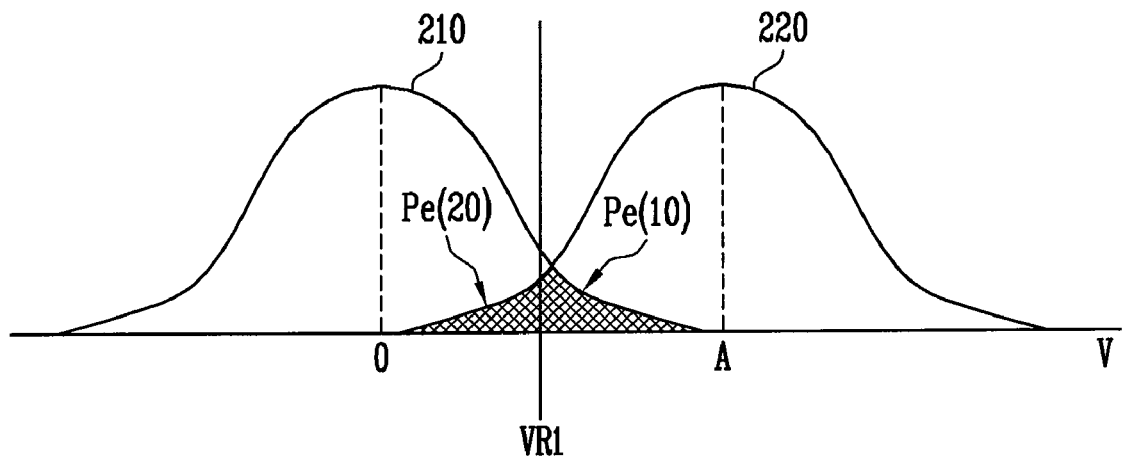
FIG. 2B is a diagram showing a changed read voltage level in the threshold voltage distributions of FIG. 2A.

FIG. 2B is a diagram showing a changed read voltage level in the threshold voltage distributions of FIG. 2A.

Referring to FIG. 2B, the longitudinal sections of the first error rate Pe(10) and the second error rate Pe(20) become substantially identical by the read voltage VR1 as described above with reference to FIG. 2A. Thus, a minimum error rate can be obtained.

The above method can be applied to threshold voltage distributions of memory cells that store 3-bit data as follows.

Figure 3A:
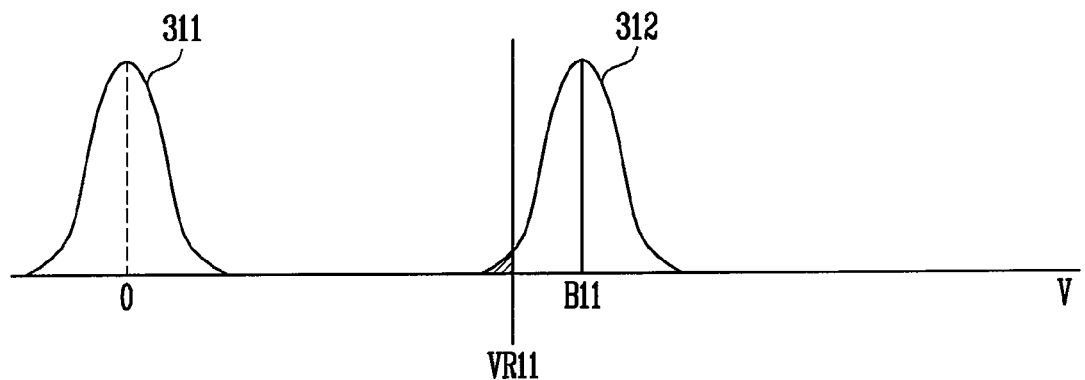
FIG. 3A is a diagram showing threshold voltage distributions according to a first page program of a memory cell capable of storing 3-bit data therein.

FIG. 3A is a diagram showing threshold voltage distributions according to a first page program of a memory cell that stores 3-bit data.

Referring to FIG. 3A, if a program of a memory cell that stores 3-bit data is performed on a first page, some memory cells belong to a first threshold voltage distribution 311 and the remaining memory cells belong to a second threshold voltage distribution 312. An intermediate value of the first threshold voltage distribution 311 is '0' and an intermediate value of the second threshold voltage distribution 312 is 'B11'.

An error probability Pe(1) at the first page is expressed in the following Equation 5.

$$Pe(1) = Q\left(\frac{VR11}{\sigma(311)}\right) + Q\left(B11 - \frac{VR11}{\sigma(312)}\right) \quad \text{[Equation 5]}$$

Here, as σ(311) and σ(312) are process constants of the first and second threshold voltage distributions 311, 312, parameters include only a read voltage VR11. Accordingly, a minimum error probability is obtained when $$\frac{dPe(1)}{dVR11} = 0.$$

If a program is performed on a second page, the threshold voltage distributions are shifted as follows.

Figure 3B:
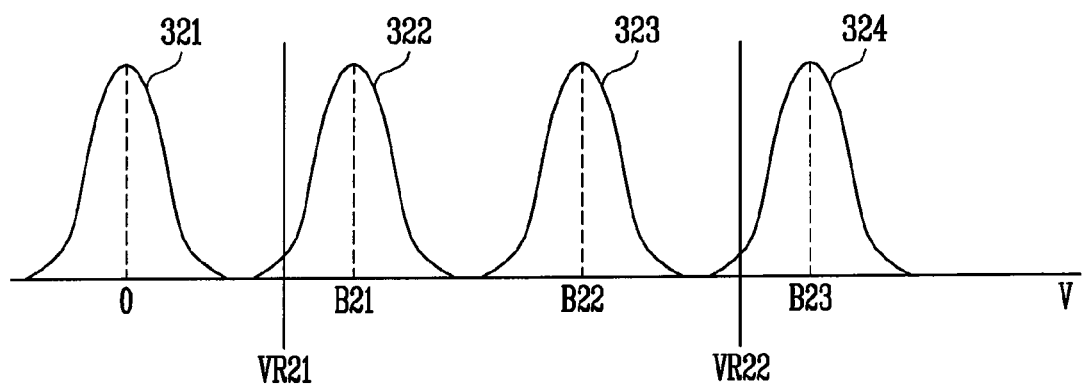
FIG. 3B is a diagram showing threshold voltage distributions according to a second page program of the memory cell of FIG. 3A.

FIG. 3B is a diagram showing threshold voltage distributions according to a second page program of the memory cell of FIG. 3A.

Referring to FIG. 3B, if a program of a memory cell that stores 3-bit data is performed on a second page subsequent to the first page, the threshold voltage distributions of the memory cells shift to first to fourth threshold voltage distributions 321 to 324.

After the second page program is carried out, an intermediate value of the first threshold voltage distribution 321 is 0, an intermediate value of the second threshold voltage distribution 322 is B21, an intermediate value of the third threshold voltage distribution 323 is B22, and an intermediate value of the fourth threshold voltage distribution 324 is B23.

Originally set read voltages are first and second read voltages VR21 and VR22.

An error rate after the second page program employing the first and second read voltages VR1, VR22, the intermediate values B21 to B23, a sigma distribution value of the threshold voltage distributions, etc. is calculated by the following Equation 6.

$$Pe(2) = Q\left(\frac{VR21}{\sigma(321)}\right) + Q\left(\frac{(B21-VR21)}{\sigma(322)}\right) + \\ Q\left(\frac{(B22-VR22)}{\sigma(323)}\right) + Q\left(\frac{(B23-VR22)}{\sigma(324)}\right)$$

[Equation 6]

Each sigma function σ(x) is a distribution probability function of each threshold voltage distribution. In order to minimize the total error rate Pe(2) in Equation 6, the read voltages need to be controlled since conditions $$\frac{dPe(2)}{dVR21} = 0 \text{ and } \frac{dPe(2)}{dVR22} = 0$$

are required.

Figure 3C:
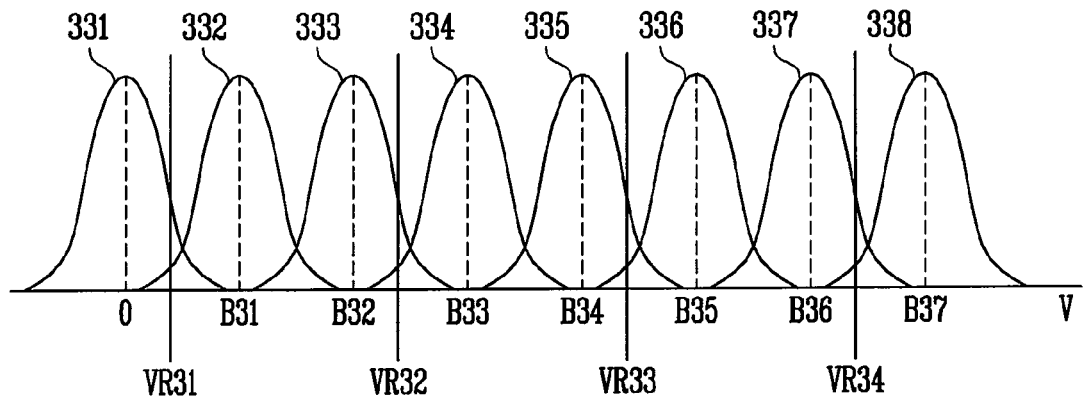
FIG. 3C is a diagram showing threshold voltage distributions according to a third page program of the memory cell of FIG. 3B.

FIG. 3C is a diagram showing threshold voltage distributions according to a third page program of the memory cell of FIG. 3B.

Referring to FIG. 3C, the memory cells on which a third page program has been performed after the first and second page programs have first to eighth threshold voltage distributions 331 to 338.

Intermediate values of the second to eighth threshold voltage distributions 332 to 338 are B31 to B37.

A total error rate Pe(3) after the third page program employing preset first to fourth read voltages VR31 to VR34 is calculated by the following Equation 7.

$$Pe(3) = Q\left(\frac{VR31}{\sigma(331)}\right) + Q\left(\frac{(B31-VR31)}{\sigma(332)}\right) + \\ Q\left(\frac{(VR32-B32)}{\sigma(333)}\right) + Q\left(\frac{(B33-VR32)}{\sigma(334)}\right) + \\ Q\left(\frac{(VR33-B34)}{\sigma(335)}\right) + Q\left(\frac{(B35-VR33)}{\sigma(336)}\right) + \\ Q\left(\frac{(VR34-B36)}{\sigma(337)}\right) + Q\left(\frac{(B37-VR34)}{\sigma(338)}\right)$$

[Equation 7]

In order to minimize the error rate Pe(3) of Equation 7, the first to fourth read voltages VR31 to VR34, which can produce conditions $$\frac{dPe(3)}{dVR31} = 0, \frac{dPe(3)}{dVR32} = 0, \frac{dPe(3)}{dVR33} = 0 \text{ and } \frac{dPe(3)}{dVR34} = 0,$$

are found and set.

The above read voltage setting process according to an embodiment of the present invention is performed as follows.

Figure 4:
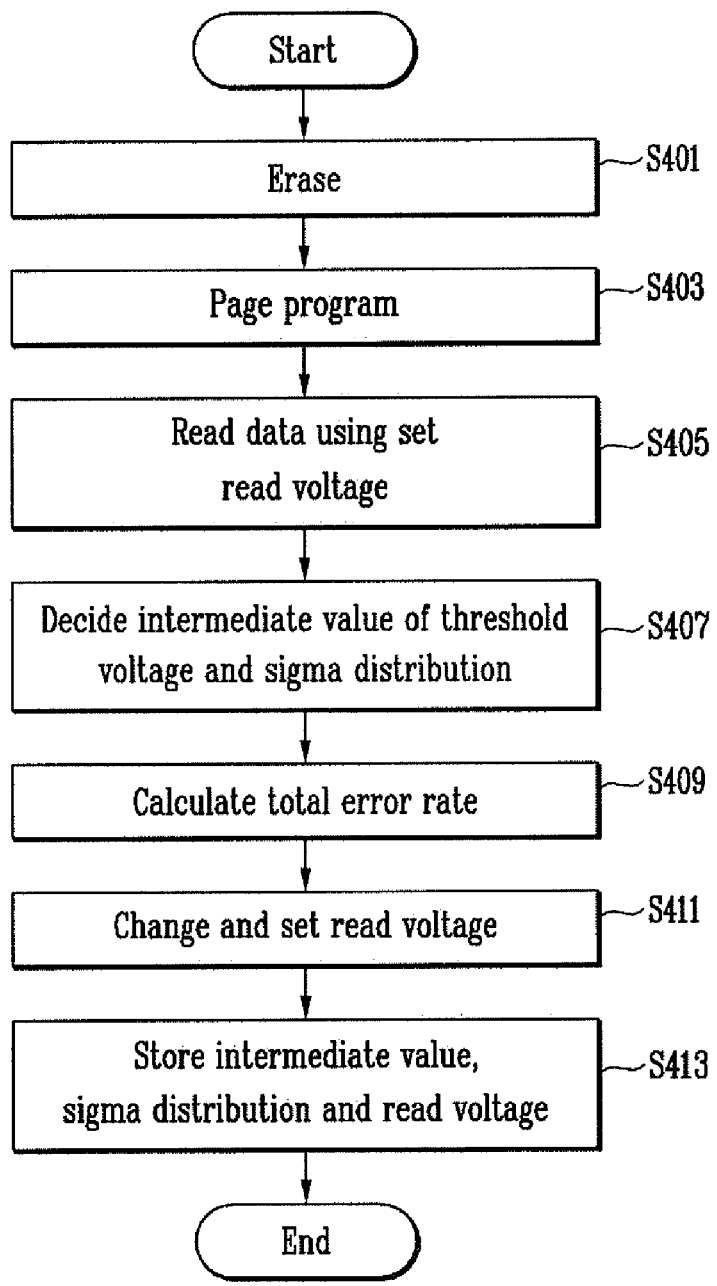
FIG. 4 is a flowchart illustrating a method of operating a non-volatile memory device according to an embodiment of the present invention.

FIG. 4 is a flowchart illustrating a method of operating a non-volatile memory device according to an embodiment of the present invention.

Referring to FIG. 4, erase and program operations are repeatedly performed on memory cells of a flash memory device. Threshold voltage distributions of the memory cells are shifted whenever erase and program cycles are repeated.

An erase operation and a page program are performed at steps S401 and S403. Programmed data is read using a set read voltage at step S405. The data is read using the read voltages. After data is erased for the first time and programmed, a set read voltage is employed. Thereafter, stored read voltage information is employed.

Threshold voltage distributions are checked using the data read at step S405. An intermediate value of each threshold voltage distribution and a sigma distribution of the threshold voltage distribution are determined at step S407. A total error rate is calculated (S409) by employing the intermediate values and the sigma distribution of the threshold voltage distributions, which are determined at step S407, and the read voltage value used to read the data at step S405.

In step S409, a read voltage that produces a minimum error rate is calculated and set at step S411. The set read voltage, the intermediate values and the sigma distribution determined in step S407 are stored at step S413. The stored read voltage is used to read data in a subsequent read voltage change process and is also used as a read voltage when performing an externally input data read command after programming.

The read voltage, the intermediate values, and the sigma distribution can be stored in an additional storage unit for storing values used to control a flash memory device. The operations, calculations, etc. of steps S401 to S413 are performed in a controller according to a stored algorithm.

Figure 5:
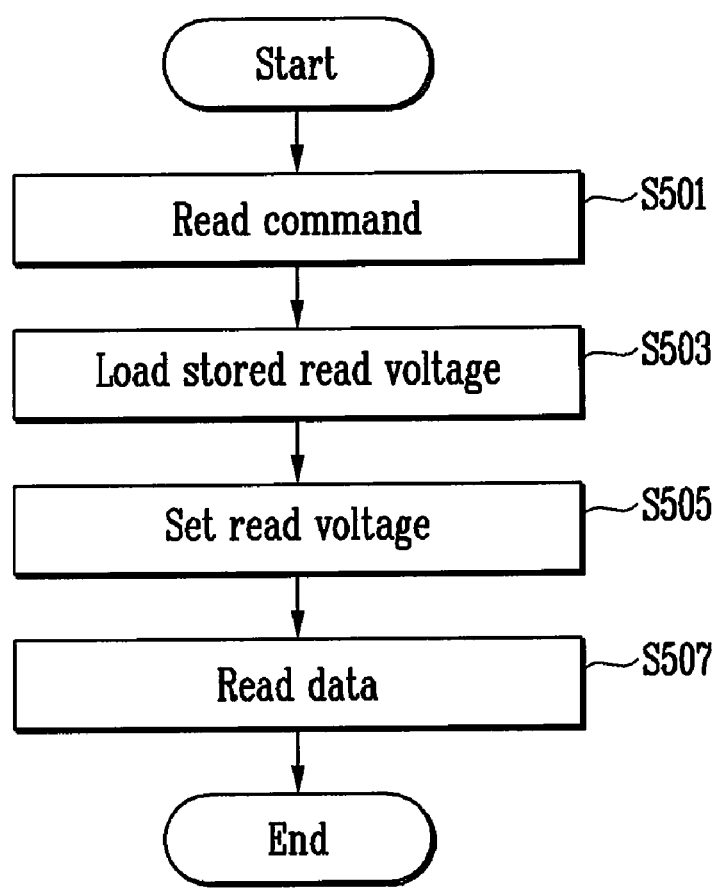
FIG. 5 is a flowchart illustrating a data read method employing a read voltage set as shown in FIG. 4.

FIG. 5 is a flowchart illustrating a data read method employing a read voltage set as shown in FIG. 4.

Referring to FIG. 5, after a read voltage is set and stored after programming as shown in FIG. 4, if a data read command is input at step S501, stored read voltage information is loaded at step S503. The stored read voltage information is read voltage information that is stored as described with reference to FIG. 4.

After the read voltage information is loaded, the loaded read voltage is set for a data read operation at step S505 and data is read using the set read voltage at step S507.

As described above with reference to FIGS. 4 and 5, after a read voltage where an error rate is minimized whenever erase and program operations are repeated is found and stored, the stored voltage is used for subsequent data reading. Accordingly, data reliability of memory cells can be increased.

As described above, according to the method of operating a non-volatile memory device in accordance with the present invention, a degree that threshold voltage distributions of memory cells are shifted and overlap each other is determined and a read voltage is changed according to the determination result. Accordingly, the error rate of data can be minimized.

The embodiments disclosed herein have been proposed to allow a person skilled in the art to easily implement the present invention, and the person skilled in the part may implement the present invention by a combination of these embodiments. Therefore, the scope of the present invention is not limited by or to the embodiments as described above, and should be construed to be defined only by the appended claims and their equivalents.

What is claimed is:

1. A method of operating a non-volatile memory device, the method comprising:
performing a least significant bit (LSB) program of memory cells;
determining a first error rate;
performing a most significant bit (MSB) program of the memory cells;

determining a second error rate; and setting a read voltage corresponding to a value where the first and second error rates are minimum values.

2. A method of operating a non-volatile memory device, the method comprising:

programming data into memory cells and reading the data stored in the memory cells using a first read voltage;

checking threshold voltage distributions of the read data;

setting a second read voltage to a voltage level at which an area where neighboring threshold voltage distributions that overlap each other becomes substantially identical for each threshold voltage distribution; and performing a data read using the set second read voltage until the memory cells are erased.

3. The method of claim 2, wherein setting the second read voltage comprises:

calculating an error probability function of the data by employing the threshold voltage distributions of the read data and the first read voltage, and setting the second read voltage to a value at which the error probability function is a minimum value.

4. The method of claim 3, wherein calculating the error probability function comprises:

determining an intermediate voltage value of each of the threshold voltage distributions of the read data and a distribution probability of each of the threshold voltage distributions; and calculating an error probability function by employing the intermediate voltage values, the distribution probability of the threshold voltage distributions, and the first read voltage.

5. The method of claim 3, wherein the error probability function is a function based on the intermediate voltage values of the threshold voltage distributions and the first read voltage.

6. The method of claim 2, wherein threshold voltage distribution information for setting the second read voltage and second read voltage information are stored.

7. The method of claim 2, wherein when the memory cell has two or more logical pages, the second read voltage is set to each of the logical pages.

8. The method of claim 2, wherein the second read voltage is set again when a predetermined number of program/erase cycles is performed.

9. The method of claim 2, wherein the second read voltage is set again when a predetermined number of error bits occur.

10. A method of operating a non-volatile memory device, the method comprising:

programming data into memory cells and reading the data stored in the memory cells using a first read voltage;

calculating an error probability function of the data by employing threshold voltage distributions of the read data and the first read voltage;

calculating a second read voltage to be a value at which the error probability function is a minimum value; and storing the calculated error probability function and the calculated second read voltage.

11. The method of claim 10, wherein calculating the error probability function comprises:

determining an intermediate voltage value of each of the threshold voltage distributions of the read data and a distribution probability of each of the threshold voltage distributions; and calculating the error probability function by employing the intermediate voltage values, the distribution probability of the threshold voltage distributions, and the first read voltage.

12. The method of claim 11, wherein the intermediate voltage values and the distribution probability of the threshold voltage distributions are stored.

13. The method of claim 10, wherein the second read voltage is a voltage at which the error probability calculated by the error probability function is a minimum value.

14. The method of claim 10, further comprising performing data reading employing the stored second read voltage until the memory cells are erased.

15. The method of claim 10, wherein when the memory cell has two or more logical pages, the read voltage is set to each of the logical pages.

16. The method of claim 10, wherein the error probability function is a function based on intermediate voltage values of the threshold voltage distributions and the first read voltage.

17. The method of claim 10, wherein the second read voltage is set again when a predetermined number of program/erase cycles is performed.

18. The method of claim 10, wherein the second read voltage is set again when a predetermined number of error bits occur.

* * * * *